(12) United States Patent
Chang

(10) Patent No.: US 7,579,121 B2
(45) Date of Patent: Aug. 25, 2009

(54) OPTICAL PROXIMITY CORRECTION PHOTOMASKS

(75) Inventor: Ching-Yu Chang, Yilang County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 659 days.

(21) Appl. No.: 11/245,522

(22) Filed: Oct. 7, 2005

(65) Prior Publication Data

US 2007/0082275 A1    Apr. 12, 2007

(51) Int. Cl.
*G03F 1/00* (2006.01)
*G03F 1/14* (2006.01)

(52) U.S. Cl. ......................................................... 430/5
(58) Field of Classification Search ...................... 430/5
See application file for complete search history.

(56) References Cited

U.S. PATENT DOCUMENTS 5,786,113 A * 7/1998 Hashimoto et al. ............. 430/5
5,821,014 A   10/1998 Chen et al. ..................... 430/5

* cited by examiner

*Primary Examiner*—Mark F Huff
*Assistant Examiner*—John Ruggles
(74) *Attorney, Agent, or Firm*—Thomas, Kayden, Horstemeyer & Risley

(57) ABSTRACT

An optical proximity correction photomask comprises a transparent substrate, a main feature having a first transmitivity disposed on the transparent substrate and at least one assist feature having a second transmitivity disposed to each side of the main feature and on the transparent substrate, wherein the first transmitivity is not equal to the second transmitivity.

14 Claims, 16 Drawing Sheets

OPTICAL PROXIMITY CORRECTION PHOTOMASKS

BACKGROUND

The present invention relates generally to semiconductor fabrication, and more particularly to optical proximity correction (OPC) photomasks for use in such semiconductor fabrication.

FIG. 1 shows an example photomask 100 having a semiconductor design with a main feature 102, according to the prior art. The main feature 102 is specifically a line, which has a critical dimension CD, which is specifically a width. Preferably, the main feature 102 should be imprinted on a layer of photoresist in a manner such that the critical dimension CD does not change. However, due to diffraction or other causes, the main feature 102 is actually imprinted on the photoresist with a width that is less than the desired critical dimension CD.

FIG. 2 shows an example in which the photomask 100 of FIG. 1 is used within a lithographic process to imprint the main feature 102 on a layer of photoresist 156 that has been coated over a semiconductor substrate 154, according to the prior art. The photomask 100 is made up of a transparent substrate 152, such as quartz, and an opaque layer 164, such as chrome, in which the main feature 102 having the critical dimension CD has been patterned. The photoresist 156 is exposed to light 160 or another source of radiation through the photomask 100. Preferably, the non-exposed area 162 within the photoresist 156 should have a critical dimension, or width, 158 that is equal to the critical dimension CD of the main feature 102 within the mask 100. However, due to diffraction or other causes, as has been noted the actual width 158 is less than the critical dimension CD of the main feature 102, which is undesirable.

OPC can be used to correct the isolated-dense proximity effect and the isolated-feature depth of focus reduction by adding assist features known as scattering bars (SB's) and anti-scattering bars (ASB's) near the edges of opaque and clear features, respectively, on a photomask. SB's are sub-resolution opaque-like features, whereas ASB's are sub-resolution clear-like features. Both serve to alter the images of isolated and semi-isolated lines to match those of densely nested lines, and improve depth of focus so that isolated lines can be focused as well as dense lines with the lithography equipment.

One of the goals in integrated circuit fabrication is to faithfully reproduce the original circuit design on the semiconductor substrate (via the mask). Currently, various optical proximity correction (OPC) techniques are utilized to allow the resulting image to more accurately correspond to the desired target pattern. A common OPC technique, which is widely known, is the use of subresolution scattering bars (also referred to as assist features). For example, U.S. Pat. No. 5,821,014, discloses sub-resolution assist features, or scattering bars, used as a means to correct for optical proximity effects and have been shown to be effective for increasing the overall process window. As set forth in the cited patent, generally speaking, the optical proximity correction occurs by improving the depth of focus for the less dense to isolated features by placing scattering bars near these features. The scattering bars function to change the effective pattern density (of the isolated or less dense features) to be more dense, thereby negating the undesirable proximity effects associated with printing of isolated or less dense features. It is important, however, that the scattering bars themselves do not print on the wafer. Thus, the size of the scattering bars must be maintained below the resolution capability of the imaging system.

Notwithstanding the wide-spread use of scattering bars, there remain essentially three issues with current scattering bar technology when utilized for patterning feature dimensions at half or below the exposure wavelength. The first issue relates to inadequate protection for the main design features that severely limits focus range. The second issue relates to the fact that in a typical scattering bar solution, too many short pieces of scattering bars are generated which results in excessive demands on mask making capabilities. The third issue relates to the fact that there is no adequate solution for joining adjacent horizontal and vertical scattering bars together.

It is crucial for the assist features to be sub-resolution and have critical dimensions less than those of their corresponding main features, to ensure that the assist features do not imprint on photoresist during photolithography. Where more than one such photomask is needed, process control also becomes an issue, as it must be ensured that all the photomasks have assist features with critical dimensions less than their corresponding main features. Mask defect inspection also becomes more difficult to verify that the assist features have critical dimensions less than their corresponding main features.

Therefore, there is a need for an improved OPC mask that alleviates these shortcomings. In particular, there is a need for such a mask in which the assist features can be more easily added, but where the assist features will not be imprinted on the photoresist during photolithography. For these and other reasons, there is a need for the present invention.

SUMMARY

Accordingly, an object of the invention is to provide an optical proximity correction photomask capable of alleviating the problems of the prior arts.

Photomasks and methods of forming a pattern on a semiconductor substrate using the photomasks are provided. An exemplary embodiment of the photomask comprises a transparent substrate, a main feature having a first transmitivity disposed on the transparent substrate and at least one assist feature having a second transmitivity disposed beside the main feature and on the transparent substrate, wherein the first transmitivity is not equal to the second transmitivity.

The assist feature preferably has the same dimensions, widths or sizes as that of the main feature.

In one embodiment of the invention, the main feature may be substantially opaque while the assist feature is semi-transparent. Instead, the main feature may have a transmitivity of about 100% while the assist features are semi-transparent.

In another embodiment of the invention, the main feature is line-shaped or island-shaped.

The photomask can be used in forming a desired pattern on a semiconductor substrate with a positive photoresist layer or a negative photoresist layer thereon.

DETAILED DESCRIPTION

Figure 1:
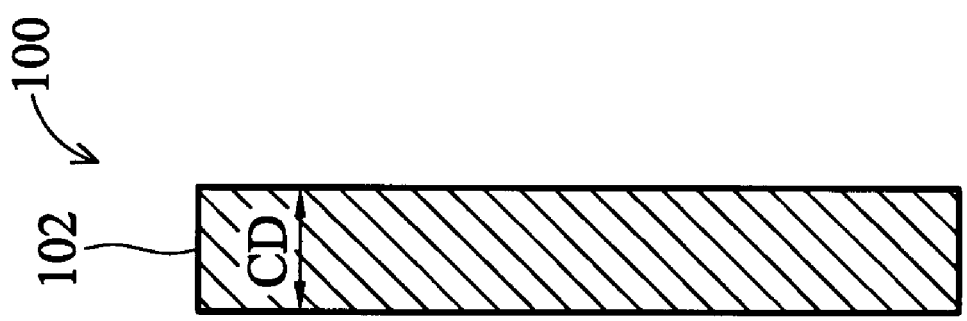
FIG. 1 is a top-view diagram of a photomask having a single main feature, specifically a line, according to the prior art.
Figure 2:
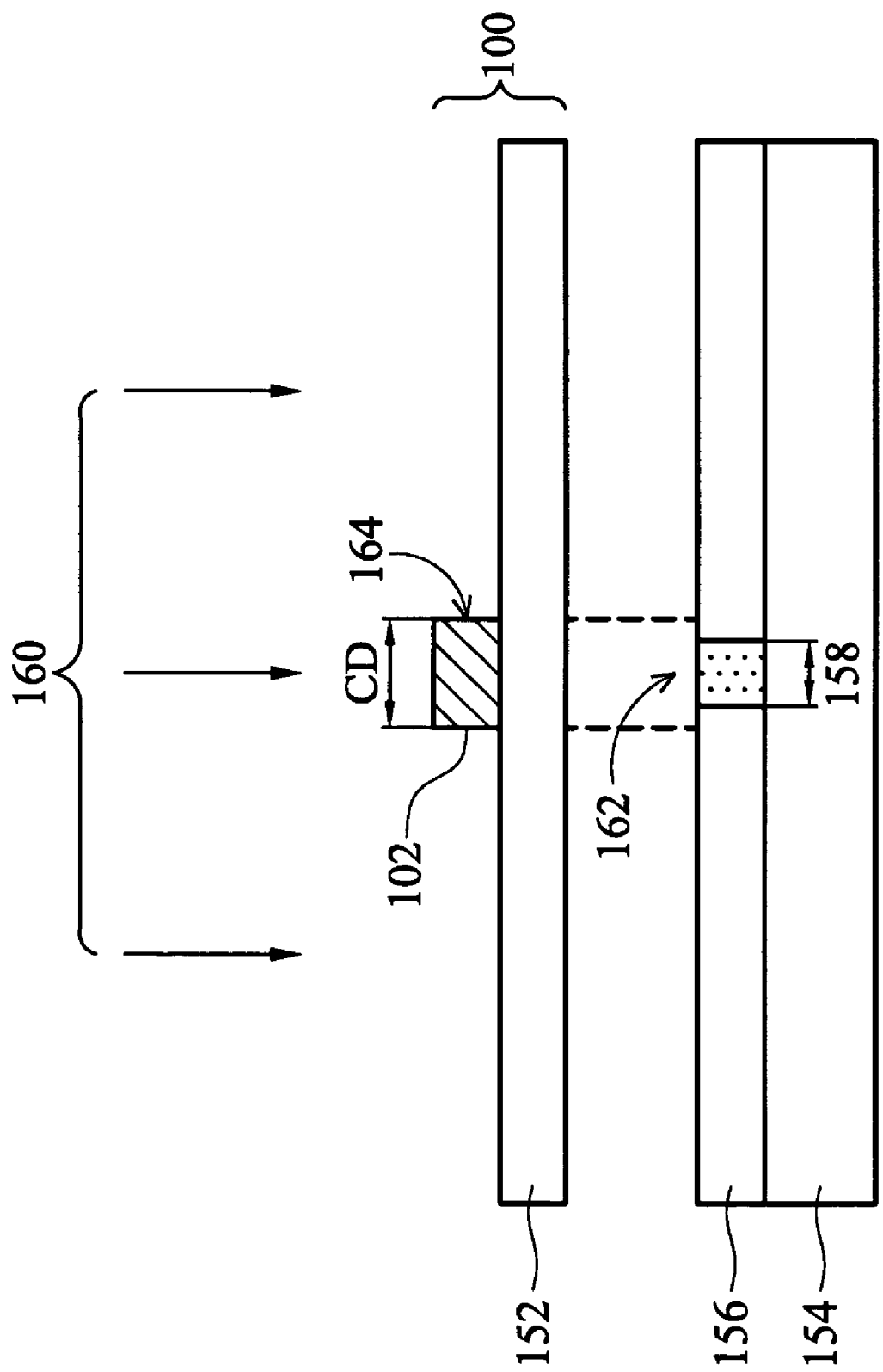
FIG. 2 is a front-view diagram depicting photolithography occurring when using the photomask of FIG. 1, according to the prior art, in which the main feature is improperly imprinted on the photoresist in that it has a critical dimension that is smaller than that of the main feature of the photomask.
Figure 3:
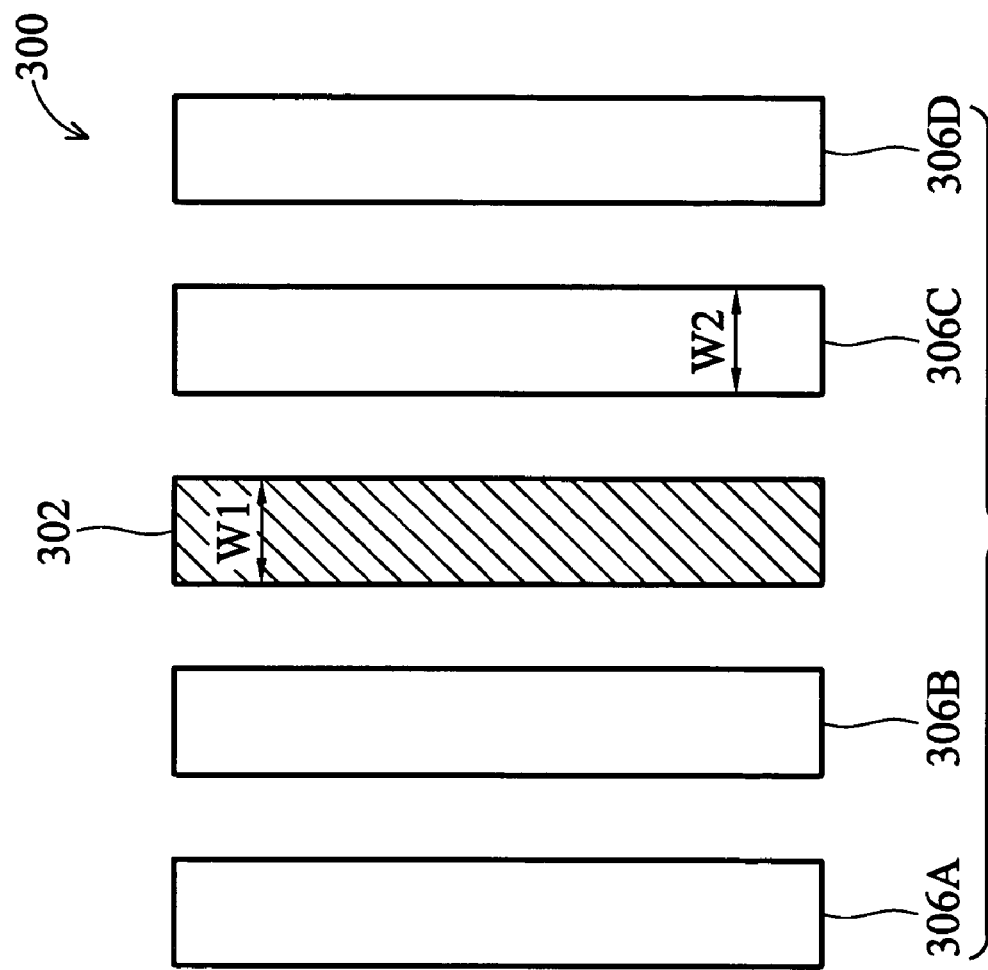
FIG. 3 is a top-view diagram of a photomask having a single main feature, specifically a line, also having a number of OPC assist features, which are also lines, according to an embodiment of the invention, where the critical dimensions of the assist features are substantially equal to the critical dimension of the main feature.

FIG. 3 shows a photomask 300 for use in fabricating a semiconductor device according to an embodiment of the invention. The photomask 300 has a semiconductor device pattern that includes a main feature 302 with optical proximity correction (OPC) assist features 306A, 306B, 306C, and 306D positioned at each side thereof which are collectively referred to as the OPC assist features 306. The main feature 302 is specifically a line, or a trench. The main feature 302 has a width W1 of critical dimension. Significantly, the assist features 306 have a width W2 being substantially equal to width W1. The main feature 302 is isolated in that it is not near any other feature of the pattern for the semiconductor device and also this main feature 302 is called "an isolated feature".

For instance, the assist features 306, although near the main feature 302, are not meant for imprinting on a semiconductor substrate—such as photoresist coated thereon—and are not part of the pattern for the semiconductor device per se. Rather, they are features that assist proper imprinting of the main feature 302 on the semiconductor substrate. As can be appreciated by those of ordinary skill within the art, while only two of the assist features 306 are shown as being present to each side of the main feature 302, this is for example purposes only. In other embodiments of the invention, as little as one of the assist features 306 may be present to each side of the main feature 302, and greater than two of the assist features 306 may be present to each side of the main feature 302. The assist features 306 are thus lines that are parallel to the main feature 302.

Figure 4:
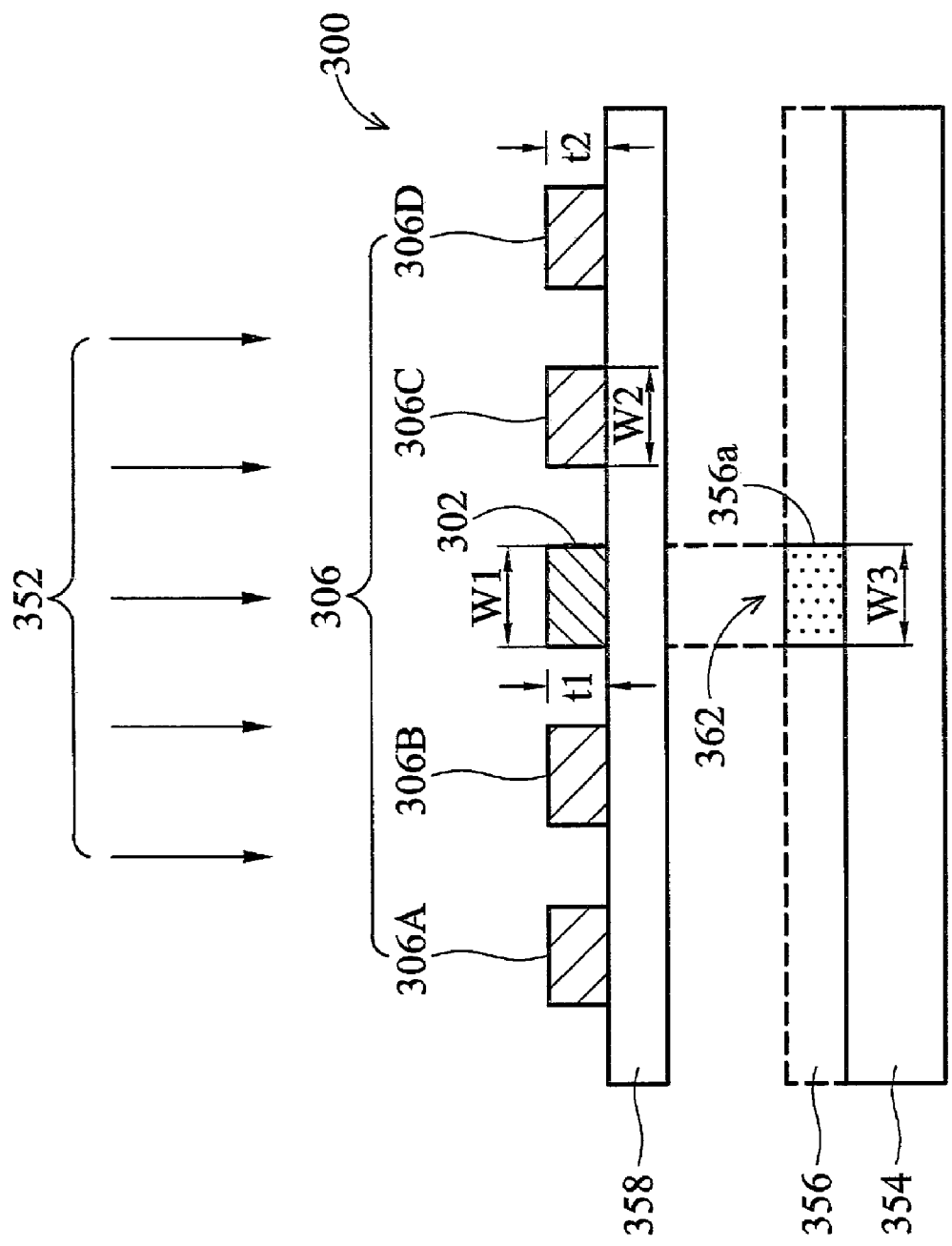
FIG. 4 is a front-view diagram depicting photolithography occurring when using the photomask of FIG. 3, according to an embodiment of the invention, in which the main feature is printed on a positive photoresist with the proper critical dimension, due to the presence of the assist features within the mask, where the assist features are not imprinted on the photoresist because they have transmitivities sufficiently greater than 0%.

FIG. 4 shows an exemplary embodiment of the invention in which the photomask 300 is used in photolithography. The photomask 300 is specifically made up of a transparent substrate 358, such as quartz, and the main feature 302 and the assist features 306 are patterned thereon. The main feature 302 is opaque, and has a transmitivity of substantially 0%. As such, it may be fabricated from chrome, or another material that at a sufficient thickness d1 does not permit light 352 or other radiation source to pass therethrough. Transmitivity can be defined, therefore, as the amount of light 352, or other radiation source, that is transmitted through a given layer. The assist features 306 also have the same thickness d2 as the main feature 302. However, the assist features 306 are fabricated from a material that at the thickness d2 does permit some of the light 352, or other radiation source, to pass therethrough. For example, the assist features 306 may be fabricated from molybdenum silicon in one embodiment of the invention. The transmitivity of the assist features 306 is therefore greater than 0%. In one embodiment, the transmitivity of the assist features 306 is greater than about 20%, and preferably between 20% and 40%.

The light 352 therefore is transmitted through the photomask 300 to be imprinted on a positive photoresist layer 356 coated on a semiconductor substrate 354. The only region within the photoresist 356 that is not exposed to the light 352 is the region 362 under and corresponding to the main feature 302 so that a line photoresist pattern 356a is formed since positive photoresist is initially insoluble in the developer and becomes soluble as a result of irradiation. The region 362 has substantially the same width W3 as the width W1 of the main feature 302, as desired. This is due to the presence of the assist features 306 prevent the region 362 from having a smaller width than the width W1 of the main feature 302. That is, the assist features 306 are OPC assist features.

However, the assist features 306 themselves are not imprinted on the positive photoresist 356 coated on the semiconductor substrate 354. That is, there are no imprinted regions of the photoresist 356 that are under and correspond to the assist features 306. This is because the transmitivity of the assist features 306 is high enough to allow sufficient amount of light 352 to pass therethrough so that none of the positive photoresist 356 under the assist features 306 remain unexposed. In other words, the assist features 306 have a transmitivity low enough to allow OPC to be performed for the main feature 302, but which is high enough so that the assist features 306 themselves are not imprinted on the positive photoresist 356, despite the assist features 306 having a width W2 equal to the width W1 of the main feature 302.

Figure 5:
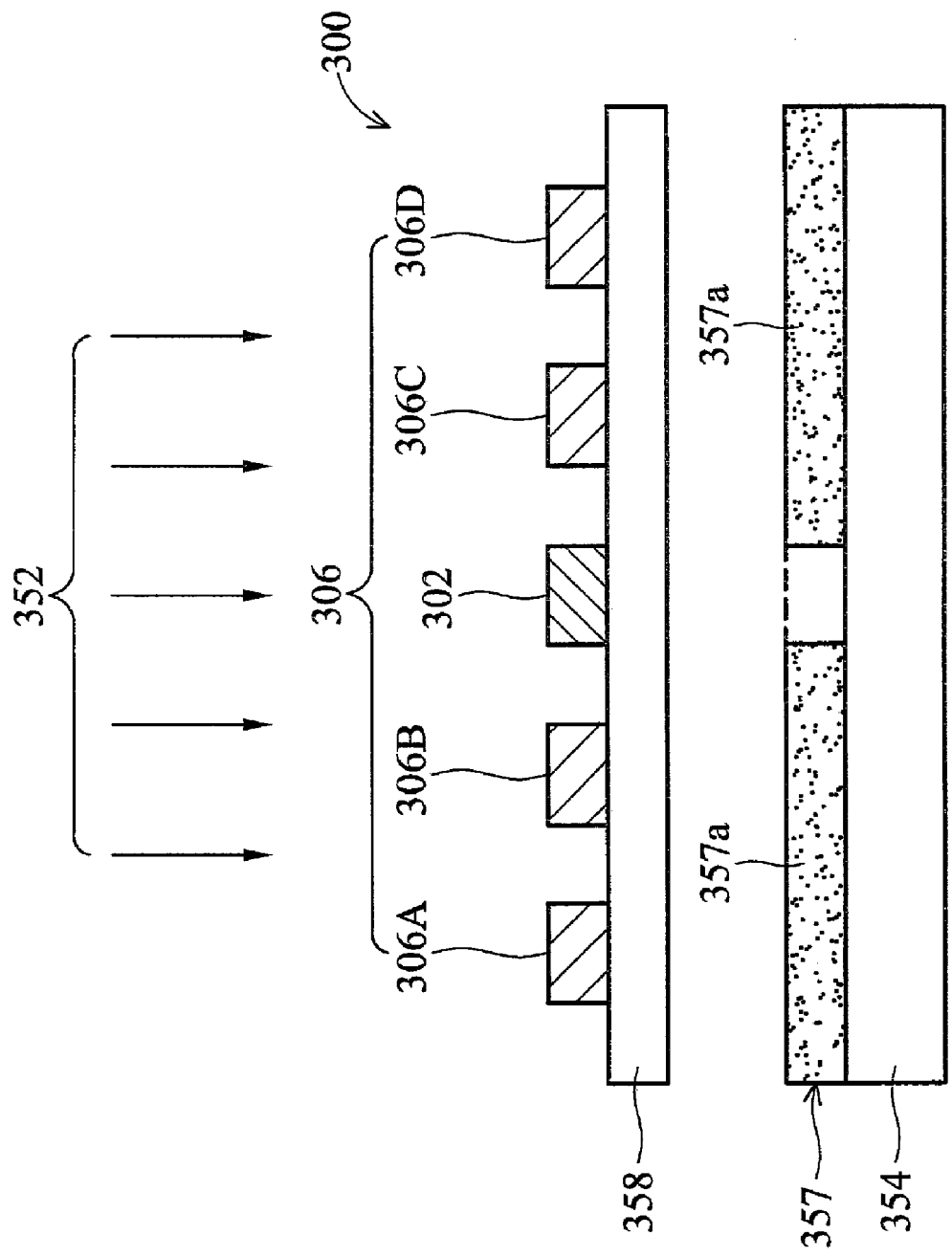
FIG. 5 is a front-view diagram depicting photolithography occurring when using the photomask of FIG. 3, according to an embodiment of the invention, in which the main feature is printed on a negative photoresist with the proper critical dimension.

FIG. 5 shows another exemplary embodiment of the invention in which the photomask 300 is used in photolithography. This embodiment is substantially the same as that mentioned in FIG. 4 except that light 352 is transmitted through the photomask 300 to imprint on a negative photoresist layer 357 coated on a semiconductor substrate 354. Since negative photoresist is initially soluble in the developer but becomes crosslinked and insoluble after irradiation, a trench photoresist pattern 357a can be formed after exposure to light 352 through the photomask 300 and developing.

Figure 6:
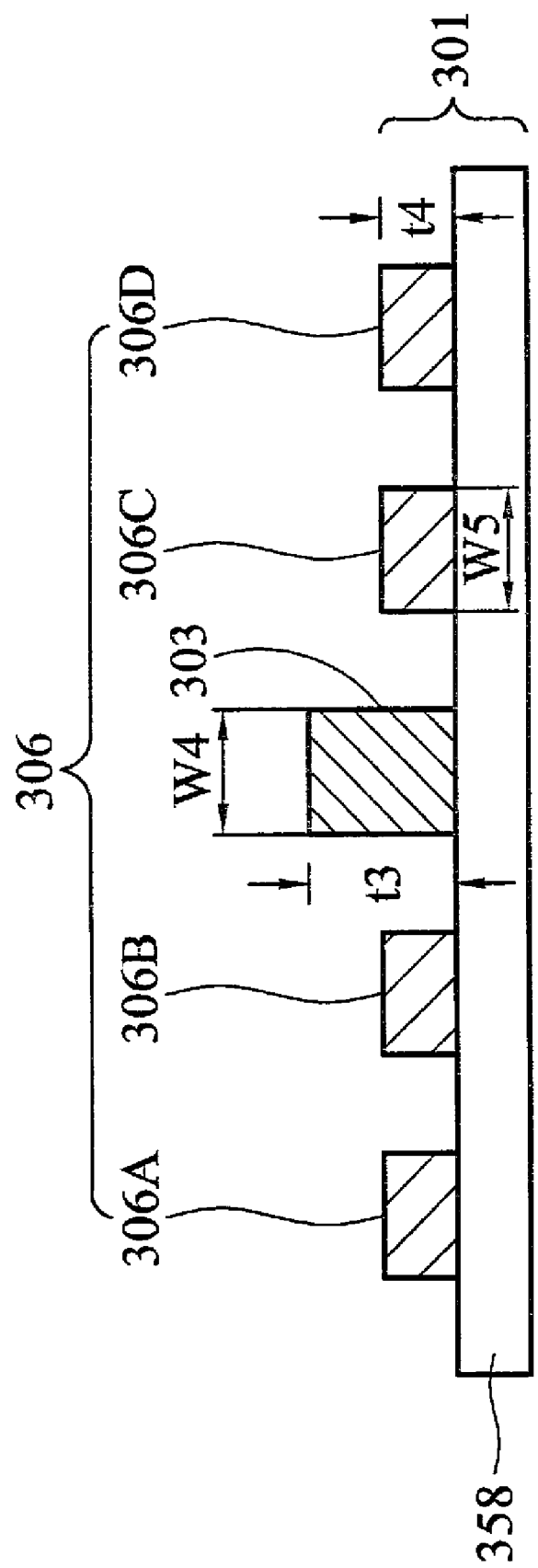
FIG. 6 is a front-view diagram of the photomask of FIG. 3 according to another embodiment of the invention, in which thickness is used, instead of material as in the embodiment of FIG. 4, to control transmitivity of light.

FIG. 6 shows the photomask 301, according to another embodiment of the invention. The main feature 303 is fabricated on the photomask 301 from the same material as that from which the assist features 306 are fabricated.

However, to ensure that light is not transmitted through the main feature 303 in the embodiment of FIG. 6, the main feature 303 is made to be thicker than the assist features 306. For instance, the main feature 303 has a thickness t3 that is greater than a thickness t4 of the assist features 306. Because light travels through more of the material from which the features 303 and 306 are made when traveling through the main feature 303, as compared to the assist features 306, the transmitivity of the main feature 303 can be made substantially 0% and the transmitivity of the assist features greater than 0%. By comparison, in the embodiment of FIG. 4, the main feature 302 has the same thickness t1 as the thickness t2 of the assist features 306. The width w5 of the assist feature 306 remains equal to the width w4 of the main feature 303 in the embodiment of FIG. 6, however. The difference between the embodiments of FIGS. 4 and 6 is therefore that material used to control transmitivity in FIG. 4, where the main and assist features have the same thickness, whereas thickness is used to control transmitivity in FIG. 6, where the main and assist features are made from the same material.

The embodiments of the invention that have been described in conjunction with FIGS. 3 to 6 relate to photomasks, in which the main feature 302 is opaque, and so that the region within the positive photoresist layer 356 or the negative photoresist layer 357 under and corresponding to the main features remains unexposed during the photolithographic process. However, other embodiments of the invention are applicable to photomasks, in which the opaque layer of a photomask is patterned so that the main feature is transparent, and so that region within the photoresist under and corresponding to the main feature is exposed during the photolithographic process.

Figure 7:
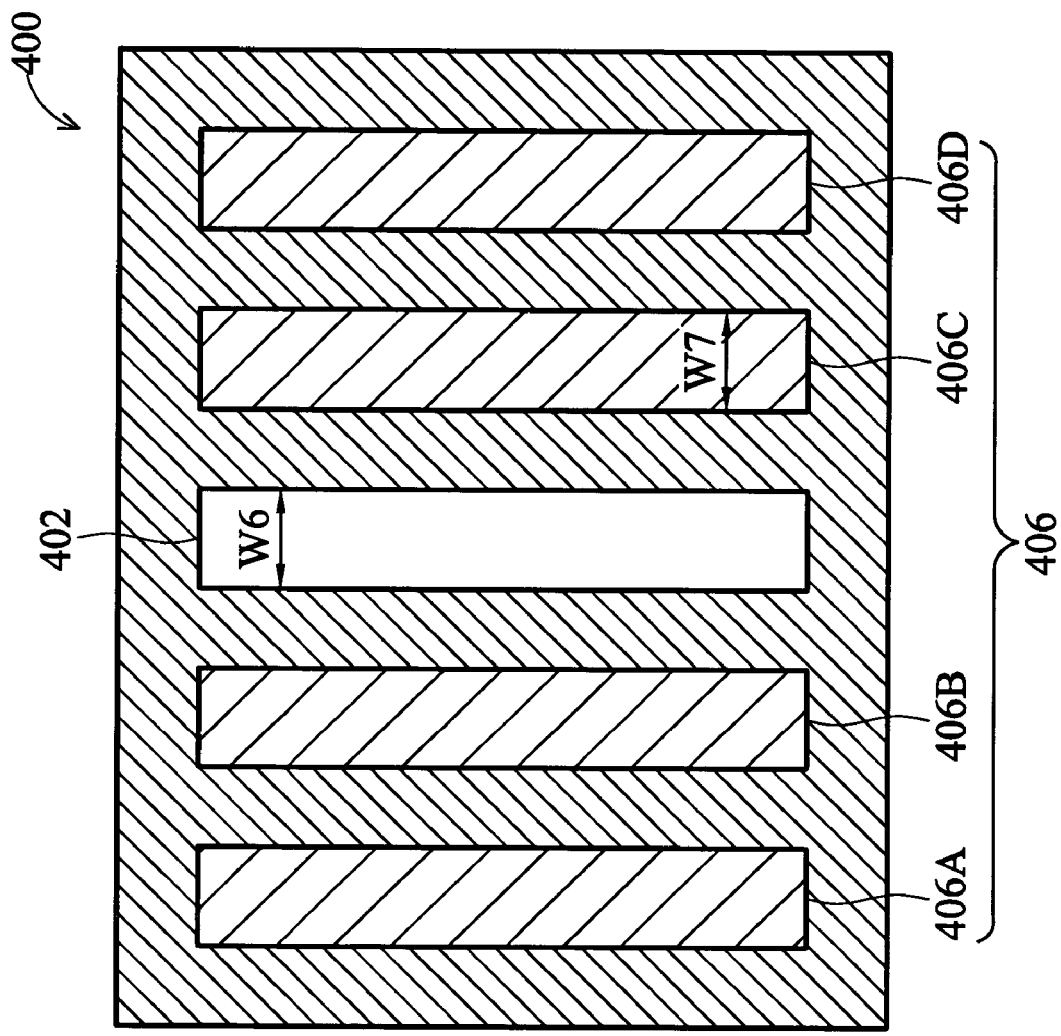
FIG. 7 is a top-view diagram of a photomask having a single main feature, specifically a line, and also having a number of OPC assist features, which are also lines, according to an embodiment of the invention, where the critical dimensions of the assist features are substantially equal to the critical dimension of the main feature.

FIG. 7 shows such a photomask 400 for use in fabricating a semiconductor device, according to an embodiment of the invention. The photomask 400 has a semiconductor device pattern that includes a main feature 402 with OPC assist features 406A, 406B, 406C, and 406D positioned at each side thereof, which are collectively referred to as the OPC assist features 406. The main feature 402 is specifically a line, or a trench. The main feature 402 has a width W6. Significantly, the assist features 406 also have a width W7 equal to the width W6 of the main feature 402. The main feature 402 is isolated in that it is not near any other features of the pattern for the semiconductor device.

For instance, the assist features 406, although near the main feature 402, are not meant for imprinting on a semiconductor substrate—such as photoresist coated thereon—and are not part of the pattern for the semiconductor device per se. Rather, they are features that assist proper imprinting of the main feature 402 on the semiconductor substrate. As can be appreciated by those of ordinary skill within the art, while only two of the assist features 406 are shown as being present to each side of the main feature 402, this is for example purposes only. In other embodiments of the invention, as little as one of the assist features 406 may be present to each side of the main feature 402, and greater than two of the assist features 406 may be present to each side of the main feature 402. The assist features 406 are thus lines that are parallel to the main feature 402.

Figure 8:
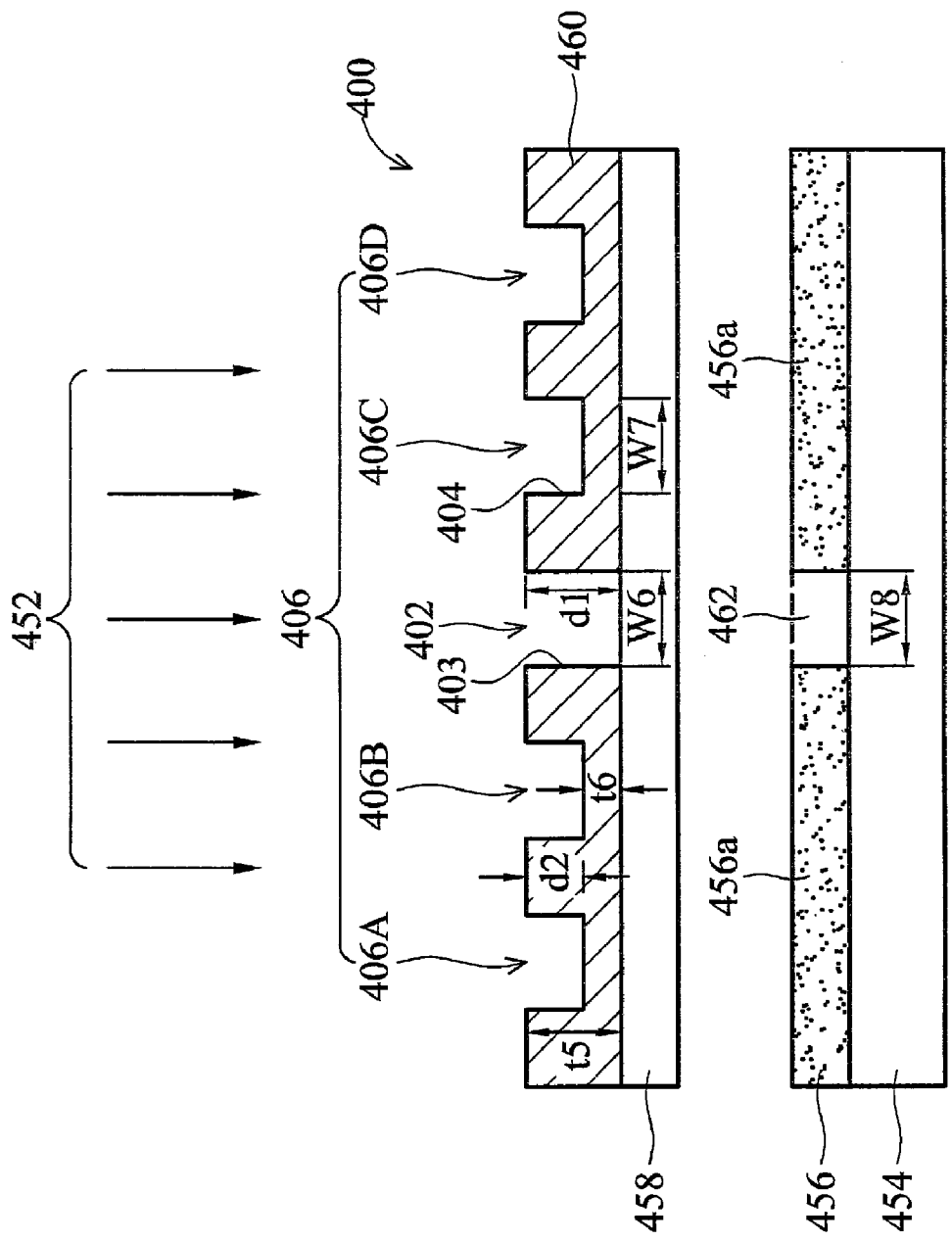
FIG. 8 is a front-view diagram depicting photolithography occurring when using the photomask of FIG. 7, according to an embodiment of the invention, in which the main feature is printed on photoresist with the proper critical dimension, due to the presence of the assist features within the mask, where the assist features are not imprinted on the photoresist because they have transmitivities sufficiently less than 100%.

FIG. 8 shows an embodiment of the invention in which the photomask 400 is used in photolithography. The photomask 400 is specifically made up of a transparent substrate 458, such as quartz, and a semi-transparent layer 460 within which the main feature 402 and the assist features 406 are patterned. The semi-transparent layer 460 may be molybdenum silicon, and/or another type of material. The semi-transparent layer 460 has a trench 403 which serves the main feature 402 and trenches 404 serving as the assist features 406A, 406B, 406C and 406D. The trench 403 within the semi-transparent layer 460 exposes the transparent substrate 458 so that the transmitivity of the main feature is substantially 100%. Also, the depth d1 of the trench 403 is greater than the depth d2 of the trenches 404 and is substantially equal to the thickness t5 of the semi-transparent layer 460 other than the assist features 406A, 406B, 406C and 460D and the main feature 402. The trench 403 may have a width substantially the same as the widths of the trenches 404. The main feature 402 is a completely removed area within the semi-transparent layer 460, and thus is clear, or transparent, having a transmitivity of substantially 100%. That is, substantially 100% of the light 452 passes through the main feature 402.

The assist features 406 are not completely removed areas within the semi-transparent layer 460. Rather, they have a thickness t6 that is less than the thickness t5 of the semi-transparent layer 460 that corresponds to the background of the photomask 400, where neither the main feature 402, the assist features 406, nor any other feature is defined. The thickness t5 is sufficiently thick so that substantially 0% of the light 452 passes through the semi-transparent layer 460 at these parts. That is to say, the semi-transparent layer 460 at these parts is substantially opaque since it is sufficiently thick. By comparison, the thickness t6 is sufficiently thick, or thin, such that the transmitivity of the assist features is less than about 80% in one embodiment, preferably between 60% and 80%.

The light 452 therefore is transmitted through the photomask 400 to imprint on a positive photoresist 456 coated on a semiconductor substrate 454 as shown in FIG. 8. The only region within the photoresist 456 that is exposed to the light 452 is the region under and corresponding to the main feature 402 so that a trench photoresist pattern 456a is formed since positive photoresist is initially insoluble in the developer and becomes soluble as a result of irradiation. The region 462 has the same width W8 as the width W6 of the main feature 402, as desired. This is due to the presence of the assist features 406 acting in their capacity as OPC assist features.

However, the assist features 406 themselves are not imprinted on the positive photoresist 456 coated on the semiconductor 454. That is, there are no imprinted regions of the photoresist 456 that are under and correspond to the assist features 406. This is because the transmitivity of the assist features 406 is low enough to sufficiently block the light 452 from pass therethrough, such that none of the positive photoresist 456 under the assist features 406 is exposed. In other words, the assist features 406 have a high enough transmitivity to allow OPC to be performed for the main feature 402, but is low enough that the assist features 406 themselves are not imprinted on the positive photoresist 456, despite the assist features 406 having a width W7 equal to width W6 of the main feature 402.

Figure 9:
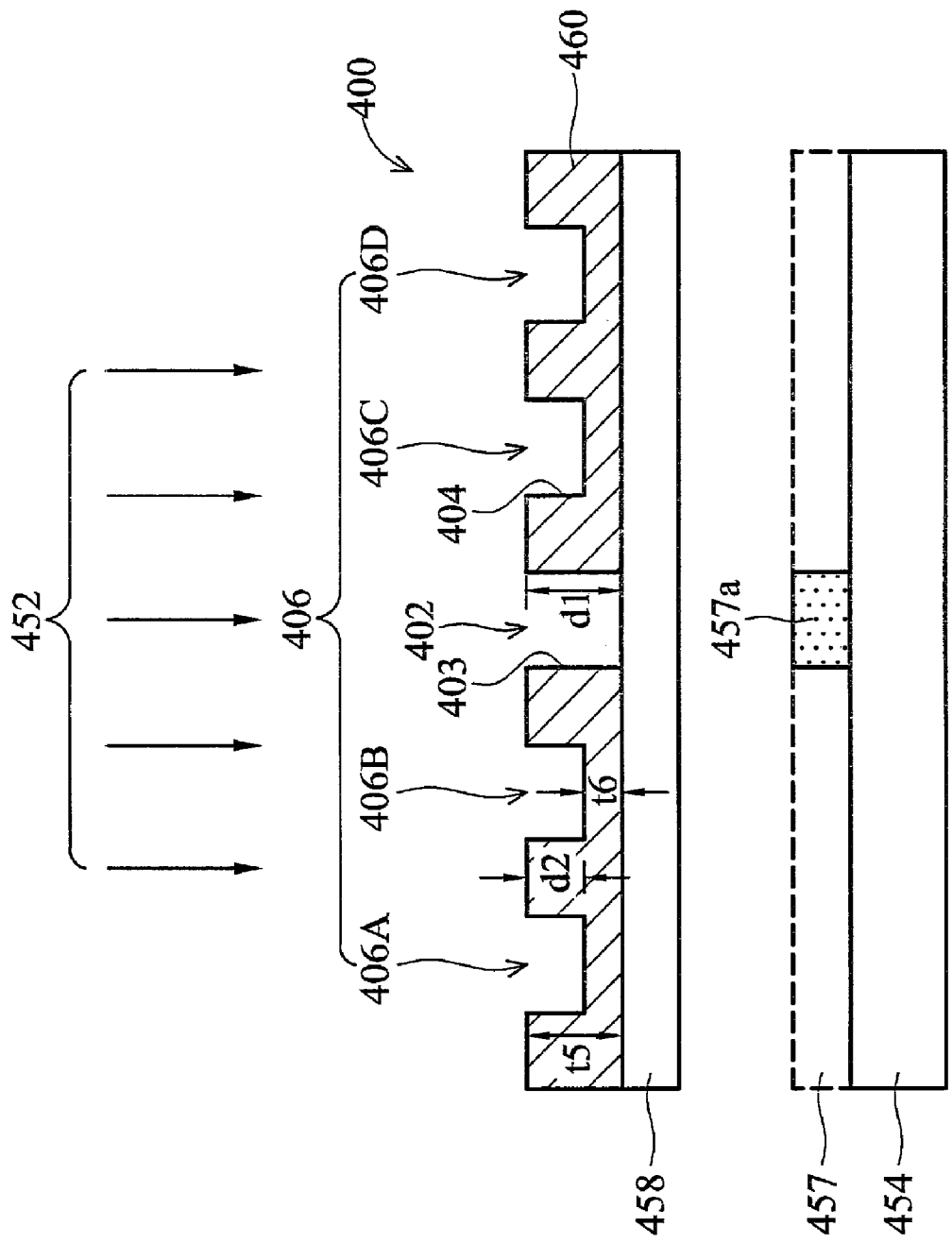
FIG. 9 is a front-view diagram depicting photolithography occurring when using the photomask of FIG. 7, according to an embodiment of the invention, in which the main feature is printed on a negative photoresist with the proper critical dimension.

FIG. 9 shows another exemplary embodiment of the invention in which the photomask 400 is used in photolithography. This embodiment is substantially the same as that mentioned in FIG. 8 except that light 452 is transmitted through the photomask 400 to imprint on a negative photoresist layer 457 coated on a semiconductor substrate 454. Since negative photoresist is initially soluble in the developer but becomes cross-linked and insoluble after irradiation, a line photoresist pattern 457a can be formed after exposure to light 452 through the photomask 400 and developing.

Figure 10:
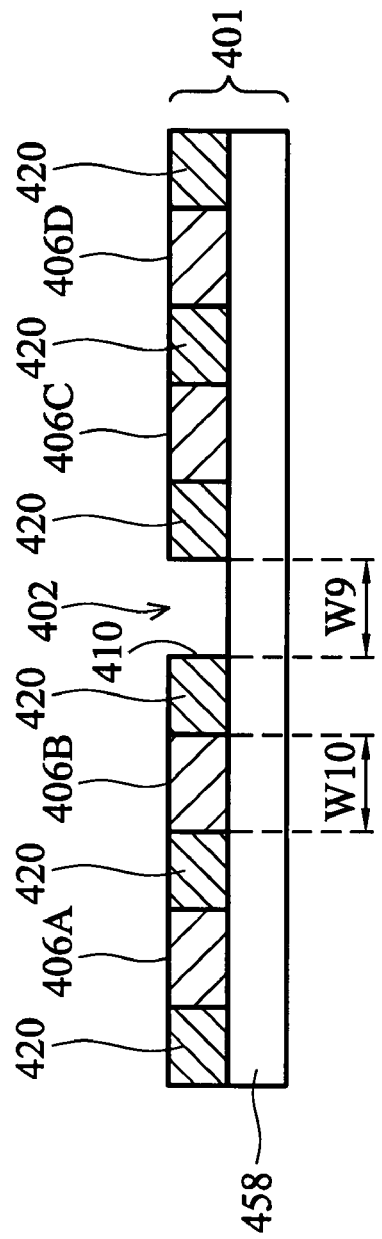
FIG. 10 is a front-view diagram of the photomask of FIG. 7 according to another embodiment of the invention, in which material is used, instead of thickness as in the embodiment of FIG. 8, to control transmitivity of light.

FIG. 10 shows a photomask 401 according to another embodiment of the invention, in which material is used, instead of thickness as in the embodiment of FIG. 8, to control transmitivity of light.

The photomask 401 includes a transparent substrate 458, a plurality of opaque features 420 formed on the transparent substrate 458, and a plurality of semi-transparent features staggered and interposed in the opaque features 420 to serve as assist features 406A, 406B, 406C and 406D. It is noted that a trench 410 exposing the transparent substrate 458 is disposed and between two of the opaque features 420 to serve as a main feature 402. The semi-transparent features preferably have a transmitivity between 60% and 80%. The main feature 402 has a width W9 substantially equal to the width W10 of the assist features. Moreover, the depth of the main feature 402 is substantially the same as the thicknesses of the assist features 406. In other words, the opaque features are coplanar with the semi-transparent features.

The photomask 401 as shown in FIG. 10 can be used in forming a photoresist pattern for creating a trench such as a shallow trench in the semiconductor substrate. That is, light or radiation is transmitted through the photomask 401 to imprint on a positive photoresist layer coated on a semiconductor substrate thus forming a trench photoresist pattern after developing during photolithography. Alternately, the photomask 401 can be used to form a line photoresist pattern on a semiconductor substrate when exposing a negative photoresist layer on the semiconductor substrate through the photomask 401.

Figure 11:
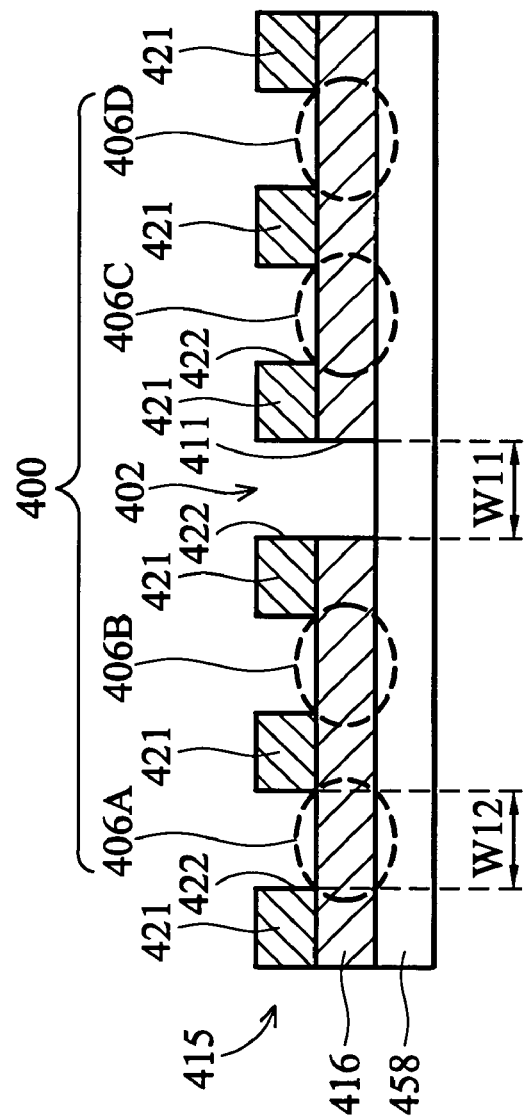
FIG. 11 is a front-view diagram of the photomask of FIG. 7 according to another embodiment of the invention.

FIG. 11 shows a front-view diagram of the photomask according to another embodiment of the invention. The OPC photomask 415 includes a transparent substrate 458, a semi-transparent layer 416 disposed on the transparent substrate 458, a trench 411 within the semi-transparent layer 416 exposing the transparent substrate 458 to serve as a main feature 402. The photomask 415 further comprises a plurality of opaque structures 421 formed on the semi-transparent layer 416 with a plurality of spaces 422 exposing the semi-transparent layer 416 to serve as assist features 406A, 406B, 406C and 406D. Note that at least one of the spaces 422 aligns with the trench 411 of the main feature 402.

The semi-transparent layer 416 preferably has a transmitivity between 60% and 80% and the main feature 402 has a width W11 substantially equal to width W12 of the assist features 406A, 406B, 406C and 406D.

The photomask 415 as shown in FIG. 11 can be used in forming a photoresist pattern for creating a trench such as a shallow trench in the semiconductor substrate. That is, light or radiation is transmitted through the photomask 415 to imprint on a positive photoresist layer coated on a semiconductor substrate thus forming a trench photoresist pattern after developing during photolithography. Alternately, the photomask 415 can be used to form a photoresist pattern for creating a line such as a metal line on a semiconductor substrate when exposing a negative photoresist layer on the semiconductor substrate through the photomask 415.

Figure 12:
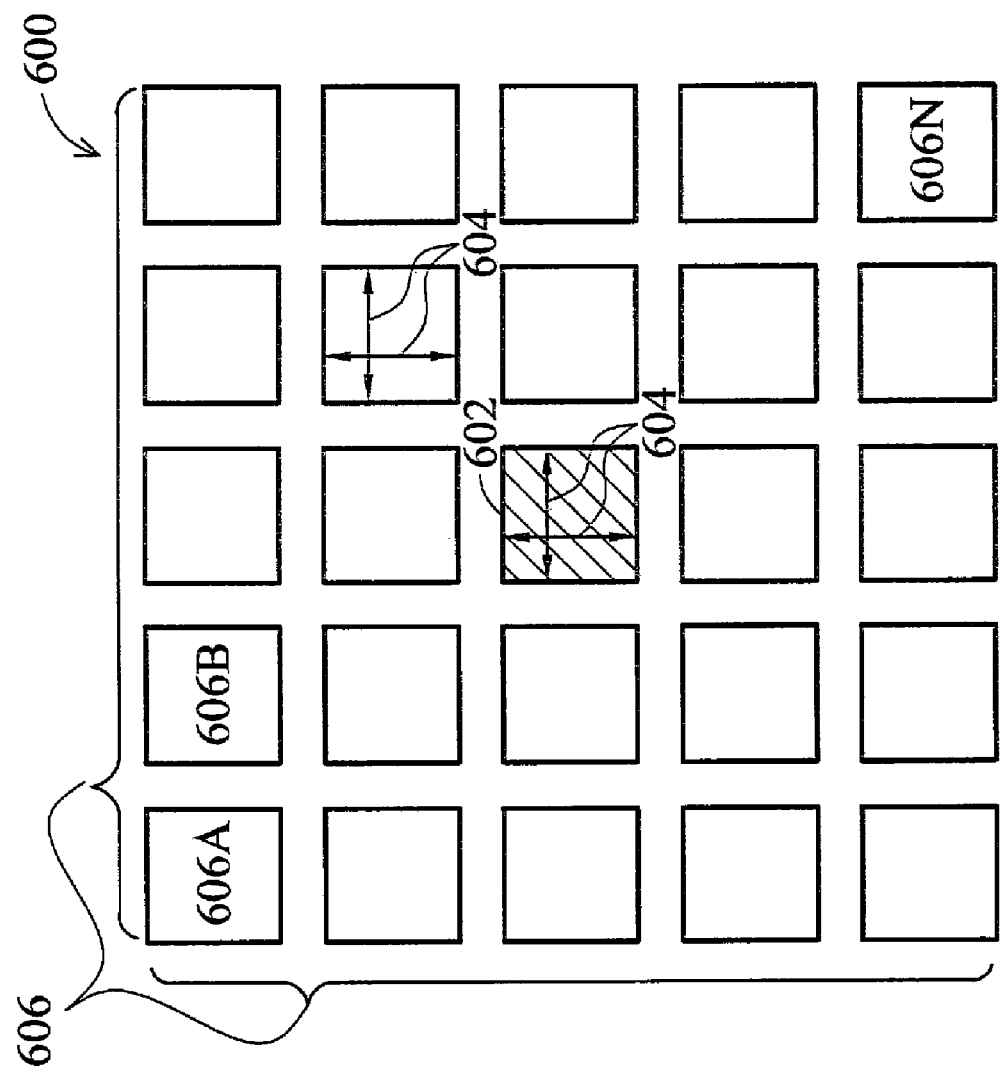
FIG. 12 is a top-view diagram of a photomask that has a single main feature, specifically a hole, and also has a number of OPC assist features, which are also holes, according to an embodiment of the invention, where the critical dimensions of the assist features are substantially equal to the critical dimension of the main feature.

FIG. 12 shows a photomask 600 in which the main feature 602 and the assist features 606A, 606B, ..., 606N, are formed on the transparent substrate (not shown). The main feature 602 and the assist features are island-shaped and the assist features 606A, 606B, ..., 606N, are disposed surrounding the main feature 602. The main feature 602 is substantially opaque, for example composed of chrome, or another material that at a sufficient thickness does not permit UV light or other radiation source to pass therethrough. The assist features 606A, 606B, ..., 606N, preferably has a transmitivity greater than about 20%, preferably 20% to 40%.

As shown particularly in FIG. 12, the main feature 602 has a critical dimension 604, and the assist features 606 have the same critical dimension 604. The critical dimension 604 of the assist features 606 being the same as the critical dimension 604 of the main feature 602 ensures that the main feature 602 is properly imprinted on the photoresist with the correct critical dimension 604. The transmitivity of the assist features 606 being relatively high ensures, however, that the assist features 606 are not imprinted on the photoresist.

Figure 14:
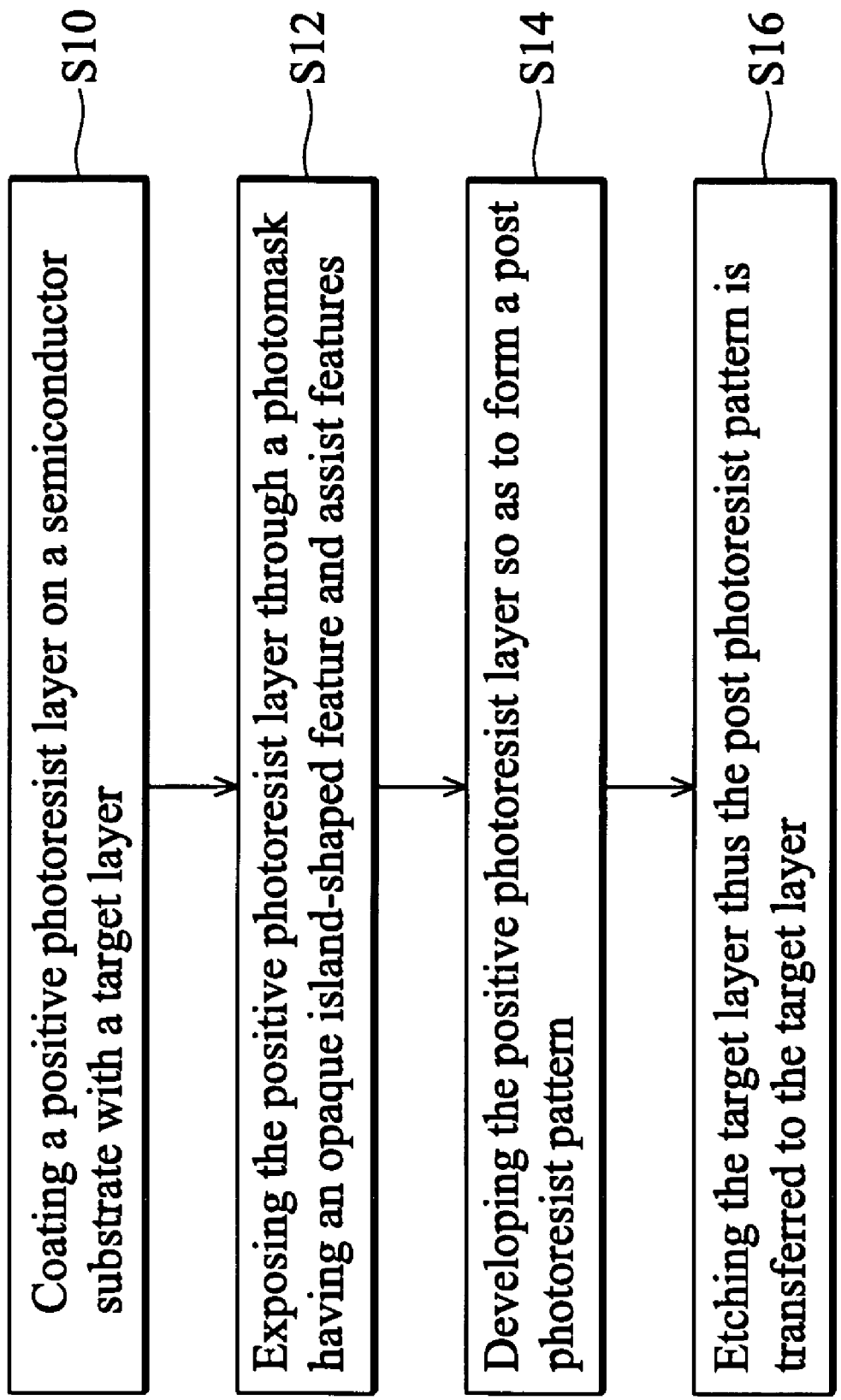
FIGS. 14 to 17 are flow charts showing methods of forming a post or a via hole on a semiconductor substrate according to the invention.

FIG. 14 illustrates an embodiment of a method of forming a post pattern on a semiconductor substrate using photomask 600 mentioned in FIG. 12. In step S10, a positive photoresist layer is coated on a semiconductor substrate with a target layer to be etched. The target layer may comprise a conductive layer, an insulating layer or a semiconductor material used in semiconductor fabrication. In step S12, the positive photoresist layer is exposed by a light or radiation through the photomask having an opaque island-shaped feature and assist features. In step S14, the positive photoresist layer is developed so as to form a post photoresist pattern. In step S16, the target layer is selectively etched, thus, the post photoresist pattern is transferred to the target layer.

Figure 15:
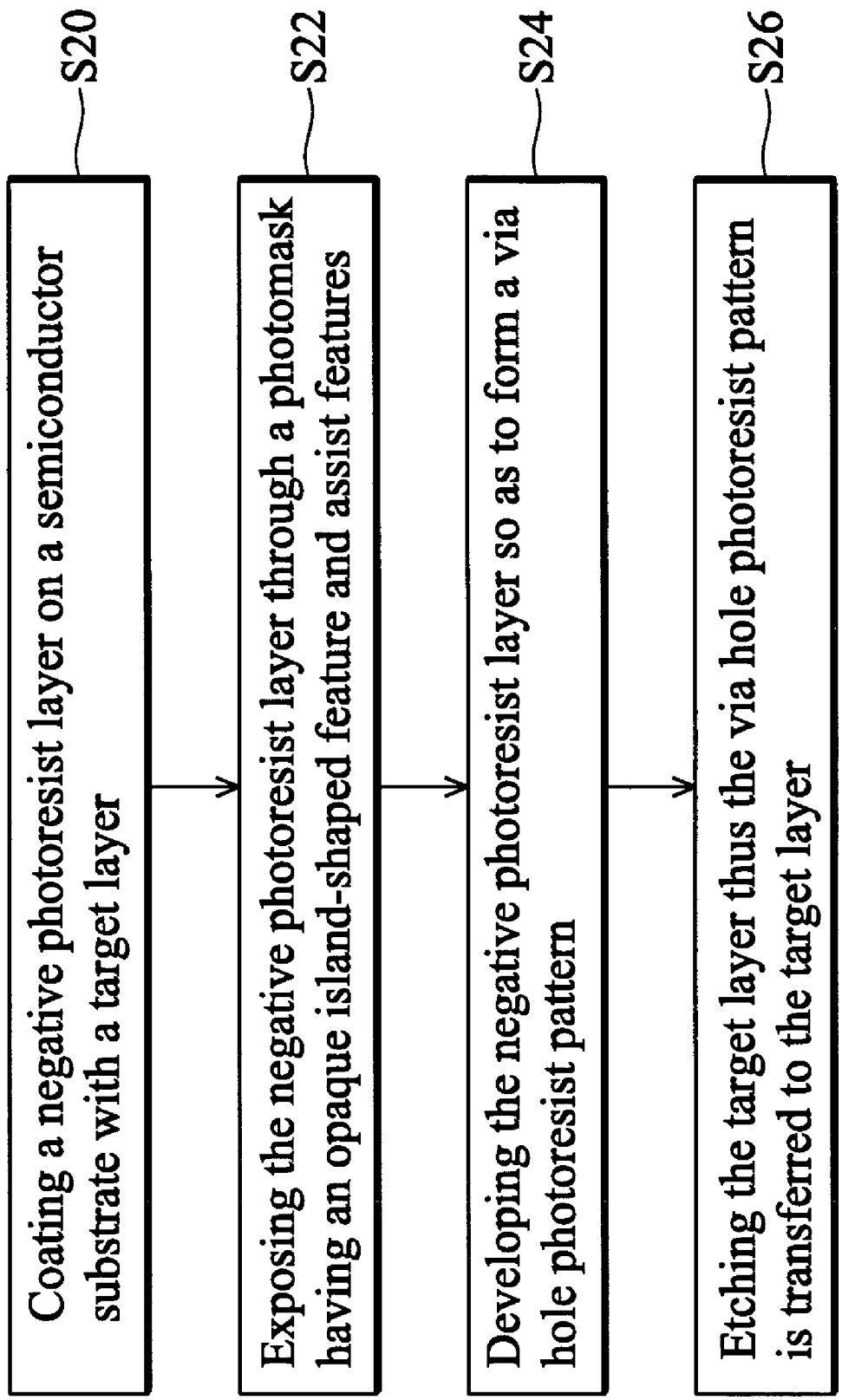

FIG. 15 illustrates an embodiment of a method of forming a via hole pattern on a semiconductor substrate using photomask 600 mentioned in FIG. 12. In step S20, a negative photoresist layer is coated on a semiconductor substrate with a target layer to be etched. The target layer may comprise a conductive layer, insulating layer or a semiconductor material used in semiconductor fabrication. In step S22, the negative photoresist layer is exposed by a light or radiation through the photomask having an opaque island-shaped feature and assist features. In step S24, the negative photoresist layer is developed so as to form a via hole photoresist pattern. In step S26, the target layer is selectively etched, thus, the via hole photoresist pattern is transferred to the target layer.

Figure 13:
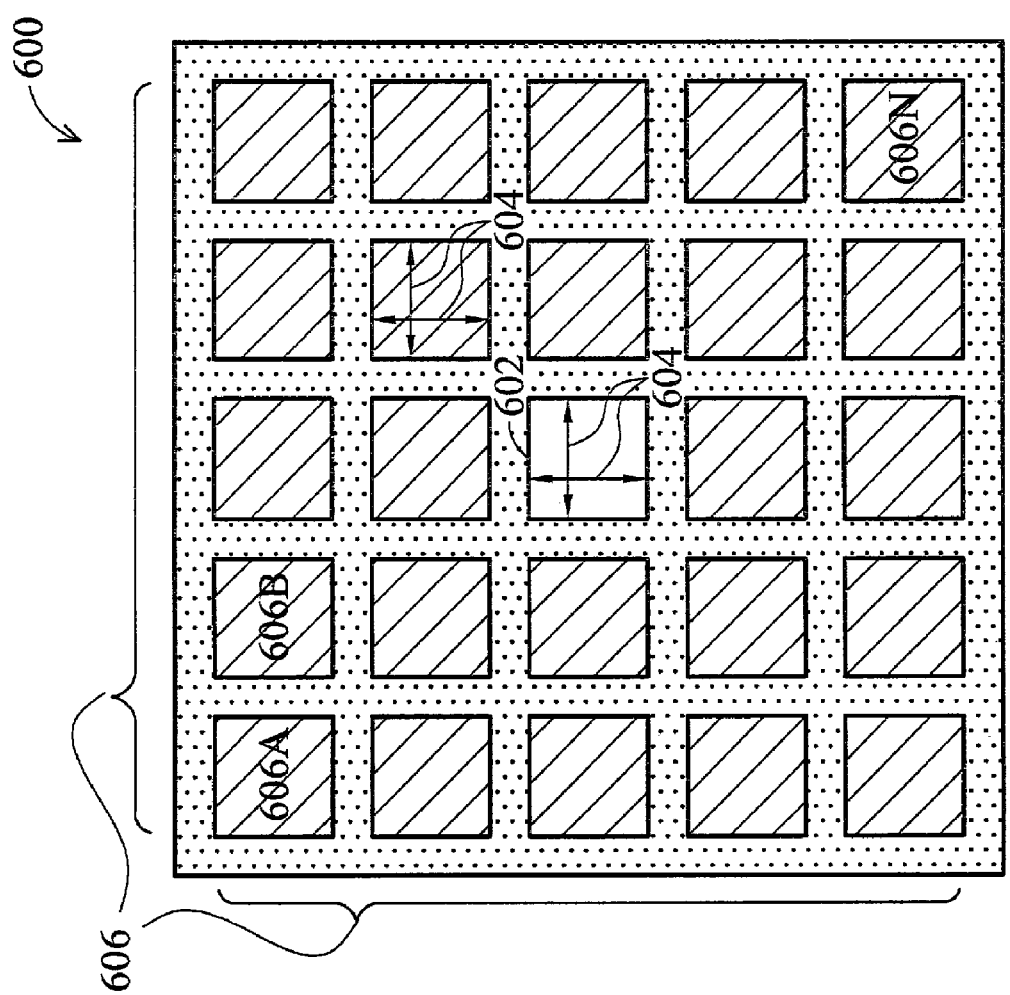
FIG. 13 is a top-view diagram of a photomask that has a single main feature, specifically a hole, and also has a number of OPC assist features, which are also holes, according to an embodiment of the invention, where the critical dimensions of the assist features are substantially equal to the critical dimension of the main feature.

FIG. 13 shows a photomask 600 in which the main feature 602 and the assist features 606A, 606B, ..., 606N, are formed on the transparent substrate (not shown). The main feature 602 and the assist features 606 are island-shaped and the assist features 606A, 606B, ..., 606N, are disposed surrounding the main feature 602. The main feature 602 is substantially clear and has a transmitivity of substantially 100%, whereas the assist features 606 have a transmitivity of less than about 80%. The critical dimension 604 of the assist features 606 being the same as the critical dimension 604 of the main feature 602 ensures that the main feature 602 is properly imprinted on the photoresist with the correct critical dimension 604. The transmitivity of the assist features 606 being relatively low ensures, however, that the assist features 606 are not imprinted on the photoresist.

Figure 16:
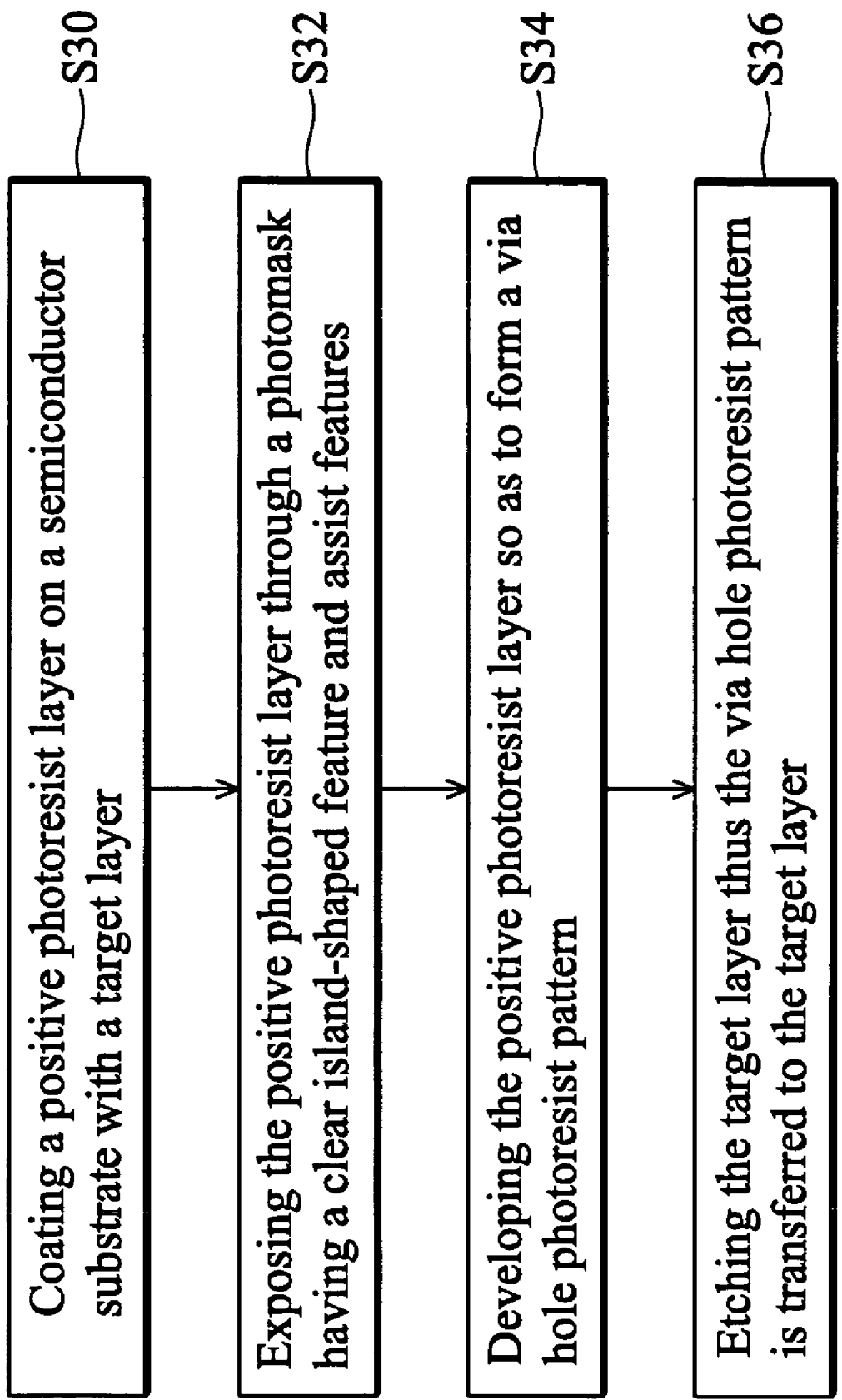

FIG. 16 illustrates an embodiment of a method of forming a via hole pattern on a semiconductor substrate using photomask 600 mentioned in FIG. 13. In step S30, a positive photoresist layer is coated on a semiconductor substrate with a target layer to be etched. The target layer may comprise a conductive layer, an insulating layer or a semiconductor material used in semiconductor fabrication. In step S32, the positive photoresist layer is exposed by a light or radiation through the photomask having a clear island-shaped feature and assist features. In step S34, the positive photoresist layer is developed so as to form a via hole photoresist pattern. In step S36, the target layer is selectively etched, thus, the via hole photoresist pattern is transferred to the target layer.

Figure 17:
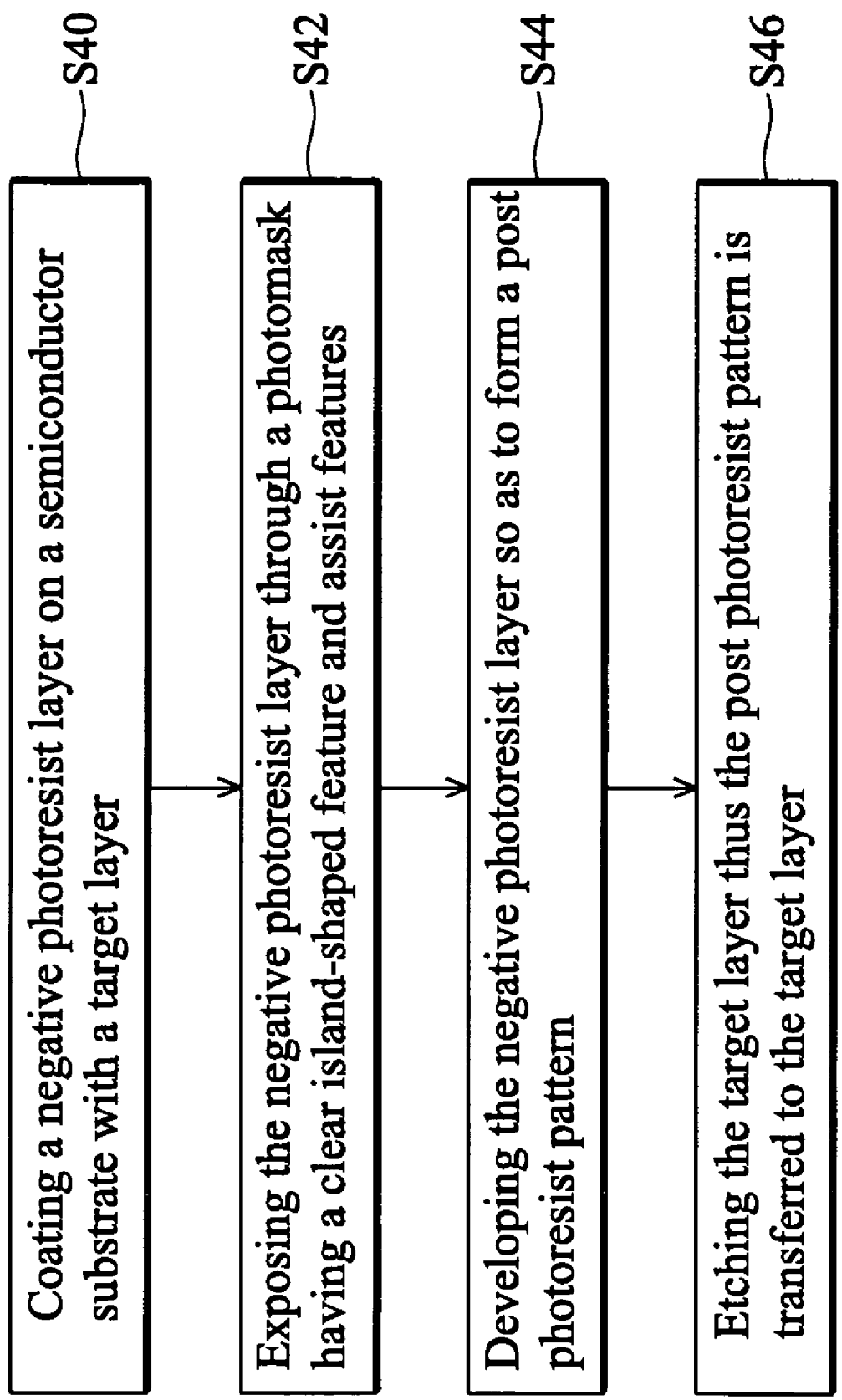

FIG. 17 illustrates an embodiment of a method of forming a post pattern on a semiconductor substrate using photomask 600 mentioned in FIG. 13. In step S40, a negative photoresist layer is coated on a semiconductor substrate with a target layer to be etched. The target layer may comprise a conductive layer, an insulating layer or a semiconductor material used in semiconductor fabrication. In step S42, the negative photoresist layer is exposed by a light or radiation through the photomask having a clear island-shaped feature and assist features. In step S44, the negative photoresist layer is developed so as to form a post photoresist pattern. In step S46, the target layer is selectively etched, thus, the post photoresist pattern is transferred to the target layer.

Therefore, a semiconductor device comprises a semiconductor substrate and an etched pattern, such as a metal line, a conductor pattern, a insulating pattern on the semiconductor substrate is obtained. The etched pattern is formed using a photoresist pattern as an etching mask manufactured through the photomask described above.

While the invention has been described with reference to various illustrative embodiments, the description is not intended to be construed in a limiting sense. Various modifications of the illustrative embodiments, as well as other embodiments of the invention, will be apparent to those people skilled in the art upon reference to this description. It is therefore contemplated that the appended claims will cover any such modifications or embodiments as may fall within the scope of the invention defined by the following claims and their equivalents.

What is claimed is:

1. An optical proximity correction photomask, comprising:
    a transparent substrate;
    a main feature having a first transmitivity disposed on the transparent substrate;
    at least one assist feature having a second transmitivity disposed to each side of the main feature and on the transparent substrate, wherein the first transmitivity is not equal to the second transmitivity,
    wherein the transparent substrate further comprises a semi-transparent layer having a first trench serving as the main feature and at least one second trench serving as the at least one assist feature, the first trench exposing the transparent substrate and the at least one second trench formed within the semi-transparent layer.

2. The photomask as claimed in claim 1, wherein the first transmitivity is substantially equal to 0% and the second transmitivity is greater than 20%.

3. The photomask as claimed in claim 2, wherein the second transmitivity is between 20% and 40%.

4. The photomask as claimed in claim 1, wherein the main feature and the at least one assist feature are line-shaped and the at least one assist feature is substantially parallel to the main feature.

5. The photomask as claimed in claim 1, wherein the main feature and the at least one assist feature are island-shaped and the at least one assist feature is disposed surrounding the main feature.

6. The photomask as claimed in claim 1, wherein the main feature and the at least one assist feature have substantially the same width.

7. The photomask as claimed in claim 1, wherein the main feature and the at least one assist feature have substantially the same thickness.

8. The photomask as claimed in claim 1, wherein the main feature has a thickness greater than that of the at least one assist feature.

9. The photomask as claimed in claim 1, wherein the first transmitivity is substantially 100% and the second transmitivity is less than 80%.

10. The photomask as claimed in claim 9, wherein the second transmitivity is between 60% and 80%.

11. The photomask as claimed in claim 1, wherein the semi-transparent layer has a transmitivity less than 80% corresponding to the at least one assist feature.

12. The photomask as claimed in claim 11, wherein the semi-transparent layer has a transmitivity of about 60% to 80% corresponding to the at least one assist feature.

13. The photomask as claimed in claim 1, wherein the first trench has a depth greater than that of the second trench.

14. The photomask as claimed in claim 1, wherein the first trench has a width equal to that of the at least one second trench.

* * * * *